United States Patent
Dasgupta et al.

(10) Patent No.: US 9,083,359 B2
(45) Date of Patent: Jul. 14, 2015

(54) LOCK DETECTOR BASED ON CHARGE PUMP

(71) Applicant: MediaTek Singapore Pte. Ltd., Singapore (SG)

(72) Inventors: Uday Dasgupta, Singapore (SG); Chong Huang, Singapore (SG); Tieng Ying Choke, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 18 days.

(21) Appl. No.: 13/851,942

(22) Filed: Mar. 27, 2013

(65) Prior Publication Data

US 2014/0292387 A1    Oct. 2, 2014

(51) Int. Cl.
*H03L 7/095* (2006.01)
(52) U.S. Cl.
CPC ................................. *H03L 7/095* (2013.01)
(58) Field of Classification Search
CPC ....................................................... H03L 7/095

USPC ......... 327/157, 155, 156, 141, 144, 147, 148, 327/162, 163
See application file for complete search history.

(56) References Cited

U.S. PATENT DOCUMENTS

| | | | | |
|---|---|---|---|---|
| 5,151,085 A | * | 9/1992 | Sakurai et al. | 604/22 |
| 7,342,427 B1 | * | 3/2008 | Fensore et al. | 327/157 |
| 2005/0162202 A1 | * | 7/2005 | Suzuki | 327/157 |
| 2013/0119958 A1 | * | 5/2013 | Gasperi | 323/299 |
| 2014/0014949 A1 | * | 1/2014 | Kimura et al. | 257/43 |

* cited by examiner

*Primary Examiner* — Jung H Kim
(74) *Attorney, Agent, or Firm* — Winston Hsu; Scott Margo

(57) ABSTRACT

A phase lock loop having a lock detector is provided. The lock detector is based on a replica charge pump and includes: a charge pump, a filter and a comparing circuit. The charge pump is arranged for providing an output according to a phase difference between an output signal and a reference signal. The filter is coupled to the charge pump, and is arranged for filtering the output of the charge pump to generate a filtered output voltage. The comparing circuit is coupled to the filter, and is arranged for comparing the filtered output voltage with a threshold setting to generate a lock indication signal to indicate whether the output signal is locked to the reference signal.

21 Claims, 5 Drawing Sheets

LOCK DETECTOR BASED ON CHARGE PUMP

BACKGROUND

The present invention relates to a phase locked loop circuit and, more specifically, relates to a phase locked loop circuit with a lock detector that is based on a replica charge pump and a method of determining a lock condition, and a phase locked loop circuit with a lock detector that is based on a replica charge pump.

FIG. 1 illustrates a related-art lock detector commonly used in an integer/fractional-N phase lock loop (PLL). In such design, the lock detector 1 has two D-type flip flops (DFF) 10 and 20. One of the DFFs samples a reference signal $S_{REF}$ at a rising edge of the signal $S_{OUT}$ outputted by a voltage controlled-oscillator or a frequency divider of the PLL while the other of the DFFs samples the signal $S_{OUT}$ at the rising edge of the reference signal $S_{REF}$. When locked, the rising edges of reference signal $S_{REF}$ and the signal $S_{OUT}$ will align. Therefore, the outputs of both DFFs will go high and an output LOCKD generated by an AND gate 50 registers a high, flagging a lock condition. However, there is always certain time delay for the DFFs to sample their respective inputs. Therefore, both of their clock inputs must be delayed by a certain amount with respect to the inputs. The two delay blocks 30 and 40 provide required delays. The delays of the two delay blocks 30 and 40 are equal under ideal conditions and let these be $t_d$.

In practice, there may still be a small delay $t_l$ between rising edges of reference signal $S_{REF}$ and the signal $S_{OUT}$ under the lock condition. Then, the delay for the delay block of a leading waveform must be adjusted to be $t_d + t_l$ while for delay block of a lagging waveform is maintained at $t_d$. Otherwise, the lock detector 10 may malfunction. In many cases, such as for a fractional-N PLL, the delay time $t_l$ is large and may dynamically change with the alternating division ratio. In such cases, it is very difficult to determine how much delay should be set for delay blocks 30 and 40. As a result, most often, the output LOCKD does not register a steady high level, having occasional low periods when locked.

SUMMARY

It is one objective of the present invention of to provide a lock detector and a method of determining a lock condition which are usable in a variety of PLL clock synthesizer applications. It is another objective of the present invention to provide a PLL with a lock detector.

The present invention uses a charge pump with a low-pass filter that averages the output from the charge pump. A window comparator is then used to determine a lock condition depending on an output of the low pass filter. Since the output of the charge pump is filtered, any jitter during the lock condition can be averaged out. Thus, the inventive lock detector can register a steady high level all throughout the lock condition.

According to one exemplary embodiment of the present invention, a phase lock loop having a lock detector is provided, which comprises: a phase frequency detector, a first charge pump, a loop filter, an oscillator and a lock detector. The phase frequency detector is arranged for generating a first control signal and a second control signal according to a phase difference based on a reference signal and an output signal. The first charge pump is coupled to the phase frequency detector, and is arranged for providing a first output according to the phase difference. The loop filter is coupled to the first charge pump, and is arranged for generating a filtered signal according to the first output of the first charge pump. The oscillator is coupled to the loop filter, and is arranged for generating the output signal according to the filtered signal. The lock detector comprises: a second charge pump, a filter and a comparing circuit. The second charge pump is arranged for providing a second output according to the phase difference. The filter is coupled to the charge pump, and is arranged for filtering the second output of the second charge pump to generate a filtered output voltage. The comparing circuit is coupled to the filter, and is arranged for comparing the filtered output voltage with a first threshold and a second threshold to generate a lock indication signal to indicate whether the phase lock loop is in a lock condition.

According to another exemplary embodiment of the present invention, a method of determining a lock condition is provided, which comprises: utilizing a charge pump to provide an output according to a phase difference between an output signal and a reference signal; filtering the output of the charge pump to generate a filtered output voltage; and comparing the filtered output voltage with a threshold setting to generate a lock indication signal to indicate whether the output signal is locked to the reference signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
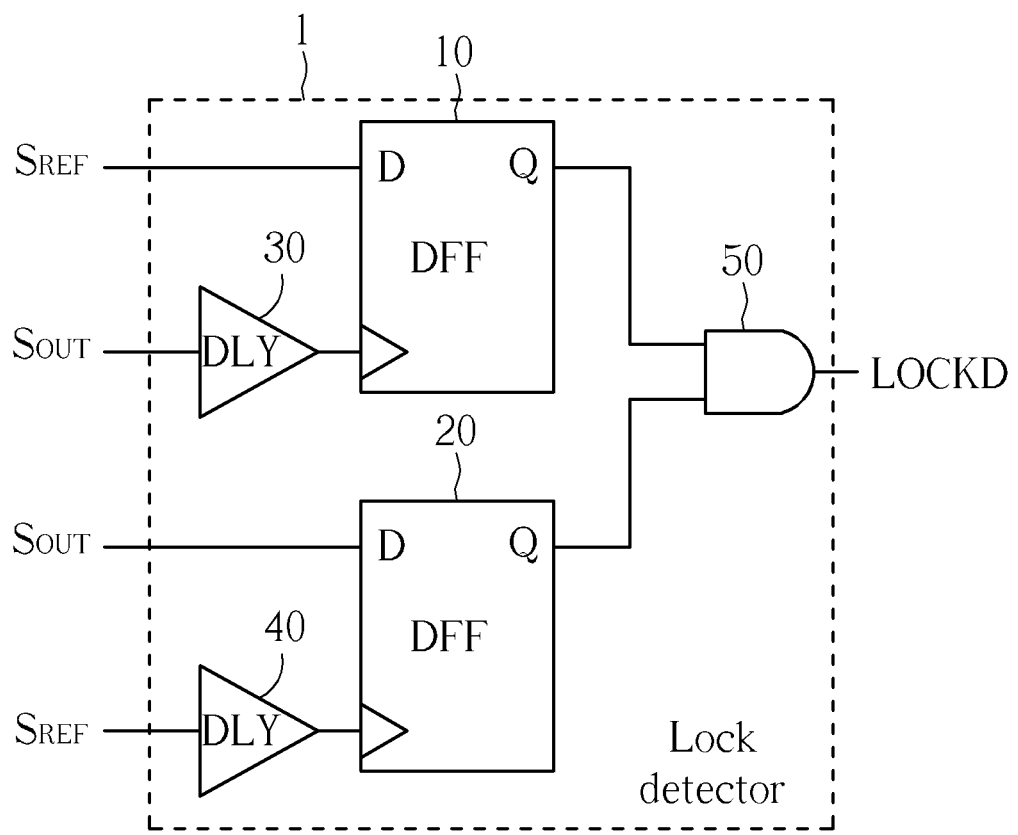
FIG. 1 is a diagram of a related-art lock detector.

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Different features of the present invention are detailed as below in reference to the figures, and for convenience of explanation, the same elements in separate figures are indicated by the same reference numerals.

Figure 2:
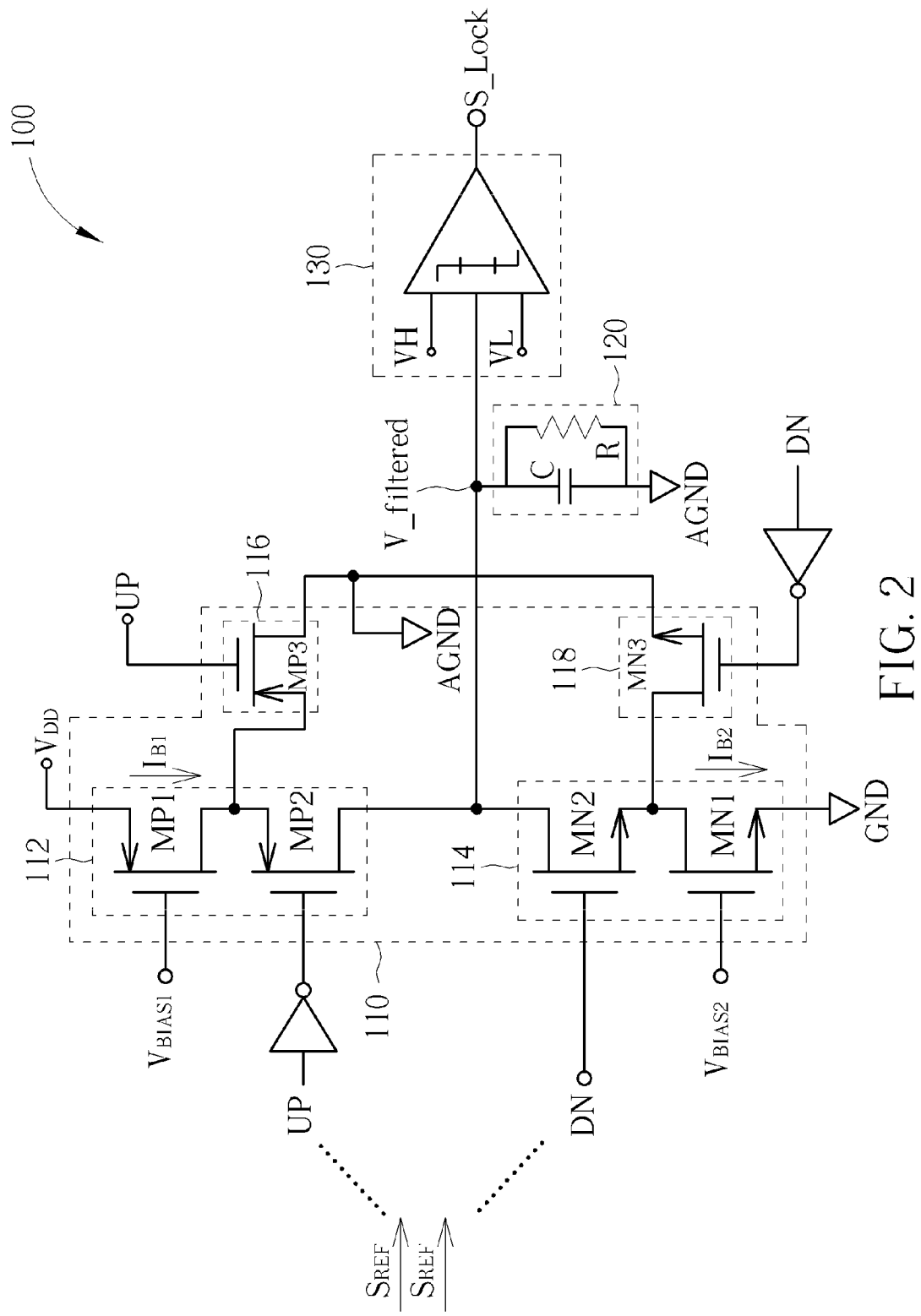
FIG. 2 is a circuit diagram of a lock detector according to one exemplary embodiment of the present invention.

Please refer to FIG. 2, which illustrates a lock detector according to one exemplary embodiment of the present invention. The lock detector detects whether an output signal is locked to a reference signal. As illustrated, a lock detector 100 comprises a charge pump 110, a filter 120 and a comparing circuit 130. The charge pump 110 is arranged for providing an output according to a phase difference between an output signal $S_{OUT}$ and a reference signal $S_{REF}$. The charge pump 110 operates to steer a current into or out of a capacitor (e.g. capacitor C of the filter 120), causing a voltage across the capacitor C to change. The time during the current is steered into or out of the capacitor C is proportional to the phase difference between the output signal $S_{OUT}$ and the reference signal $S_{REF}$. The filter 120 is coupled to the charge pump 110 and is arranged for filtering the output (e.g. the voltage across the capacitor C) of the charge pump 110 to generate a filtered output voltage V_filtered. Preferably, the filter 120 is implemented with connecting a resistor R in parallel with the capacitor C to perform low-pass filtering on the voltage across the capacitor C. The comparing circuit 130 is coupled to the filter 120, and is arranged for comparing the filtered output voltage V_filtered with a threshold setting to generate a lock indication signal S_Lock to indicate whether the output signal $S_{OUT}$ is locked to the reference signal $S_{REF}$. If a phase of the output signal $S_{OUT}$ is completely identical to the reference signal $S_{REF}$ or the phase of the output signal $S_{OUT}$ is very close to that of the reference signal $S_{REF}$, the comparing circuit 130 determines the output signal $S_{OUT}$ is locked to that of the reference signal $S_{REF}$ and indicates a lock condition by allowing the lock indication signal S_Lock to have a first level (e.g. high); otherwise, the comparing circuit 130 indicates a out-of-lock condition by allowing the lock indication signal S_Lock to have a second level (e.g. low).

In one embodiment, the charge pump 110 comprises: a pull-up circuit 112 and a pull-down circuit 114. The pull-up circuit 112 is arranged for selectively pulling up a level of the output (e.g. the voltage across the capacitor C) according to a first control signal UP that is generated based on the phase difference between the output signal $S_{OUT}$ and the reference signal $S_{REF}$. The pull-down circuit 114 is arranged for selectively pulling down the level of the output according to a second control signal DOWN that is generated based on the phase difference between the output signal $S_{OUT}$ and the reference signal $S_{REF}$. Preferably, the first control signal UP and the second control signal DOWN are signals composed of pulses. The width of the first control signal UP determines how long the voltage across the capacitor C is pulled up while the width of the second control signal DOWN determines how long the voltage across the capacitor C is pull down.

When the phase of the output signal $S_{OUT}$ is completely identical to that of the reference signal $S_{REF}$ or the phase of the output signal $S_{OUT}$ is very close to that of the reference signal $S_{REF}$, the width of the pulses of both of the first control signal UP and the second control signal DOWN are narrow and equal. As a consequence, the voltage V_filtered generated by the filter 120 is close to the analog ground AGND (which has a potential that is in-between VDD and ground). However, if the phase of the output signal $S_{OUT}$ is much different from that of the reference signal $S_{REF}$, the width of the pulses of the first control signal UP and the second control signal DOWN are unequal (i.e., one of which is large and the other of which is very small). As a consequence, the voltage V_filtered generated by the filter 120 is either considerably higher or considerably lower than the analog ground AGND. The comparator 130 then determines whether the output signal $S_{OUT}$ is locked the reference signal $S_{REF}$ according to a threshold setting regarding levels which are slightly higher and slightly lower than the level of the analog ground AGND.

By way of example, but not limited to, the pull-up circuit 112 comprises: transistors MP1 and MP2. The transistor MP1 is coupled to a supply voltage VDD, and is arranged for providing a first bias current $I_{B1}$ according to a first bias voltage $V_{BIAS1}$ coupled to a gate of the transistor MP1. The transistor MP2 is coupled to the transistor MP1 and a node of the capacitor C, and is arranged for selectively providing a first current path for first bias current $I_{B1}$ from the transistor MP1 to the node of the capacitor C according to the first control signal UP, thereby steering the first bias current $I_{B1}$ into the capacitor C to pull up the voltage across of the capacitor C. In addition, the pull-down circuit 114 comprises: transistors MN1 and MN2. The transistor MN1 is coupled to ground GND (which has a potential of zero), and is arranged for providing a second first bias current $I_{B2}$ according to a second bias voltage $V_{BIAS2}$ coupled to a gate of the transistor MN1. The transistor MN2 is coupled to the transistor MN1 and the node of the capacitor C, and is arranged for selectively providing a second current path for the second first bias current $I_{B2}$ from the node of the capacitor C to the transistor MN1 according to the second control signal DOWN, thereby steering the second bias current $I_{B2}$ out of the capacitor C to pull down the voltage across of the capacitor C.

Preferably, the charge pump 110 further comprises: a first switching circuit 116 and a second switching circuit 118. The first switching circuit 116, (e.g. a transistor MP3) is coupled to the pull-up circuit 112 and the analog ground AGND, and is arranged for preventing the first bias current $I_{B1}$ from passing through the transistor MP2 according to the first control signal UP. The second switching circuit 118 (e.g. a transistor MN3) is coupled to the pull-down circuit 114 and the analog ground AGND, and is arranged for preventing the second bias current $I_{B2}$ from passing through the transistor MN2 according to the second control signal DOWN. When the pull-up circuit 112 operates to pull up the level of the voltage across the capacitor C, the second switching circuit 118 operates to prevent the second bias current $I_{B2}$ from passing through the transistor MN2 such that the charges will not be extracted from the capacitor C. Furthermore, when the pull-down circuit 114 operates to pull down the level of the voltage across the capacitor C, the first switching circuit 116 operates to prevent the first bias current $I_{B1}$ from passing through the transistor MN2 such that the charges will not be injected into the capacitor C.

In one embodiment, the comparing circuit 130 is a window comparator which comparing the filtered output voltage V_filtered with a first threshold VH and a second threshold VL that are determined by the threshold setting. As mentioned above, when the phase of the output signal $S_{OUT}$ is completely identical to that of the reference signal $S_{REF}$ or the phase of the output signal $S_{OUT}$ is very close to that of the reference signal $S_{REF}$, the voltage V_filtered generated by the filter 120 is close to the analog ground AGND. Hence, the thresholds VH and VL are selected as voltages slighter higher and slightly lower than the analog ground AGND. Once the voltage V_filtered generated by the filter 120 falls in a region between the thresholds VH and VL, the output S_Lock of the comparing circuit 130 goes high indicating a lock condition. On the other hand, if the phase of the output signal $S_{OUT}$ is much different from that of the reference signal $S_{REF}$, the voltage V_filtered generated by the filter 120 is either considerably higher or considerably lower than the analog ground AGND. Once the voltage V_filtered generated by the filter 120 is either higher than the threshold VH or lower than the threshold VL, the output S_Lock of the comparing circuit 130 goes low indicating a indicating an out-of-lock condition.

Figure 3:
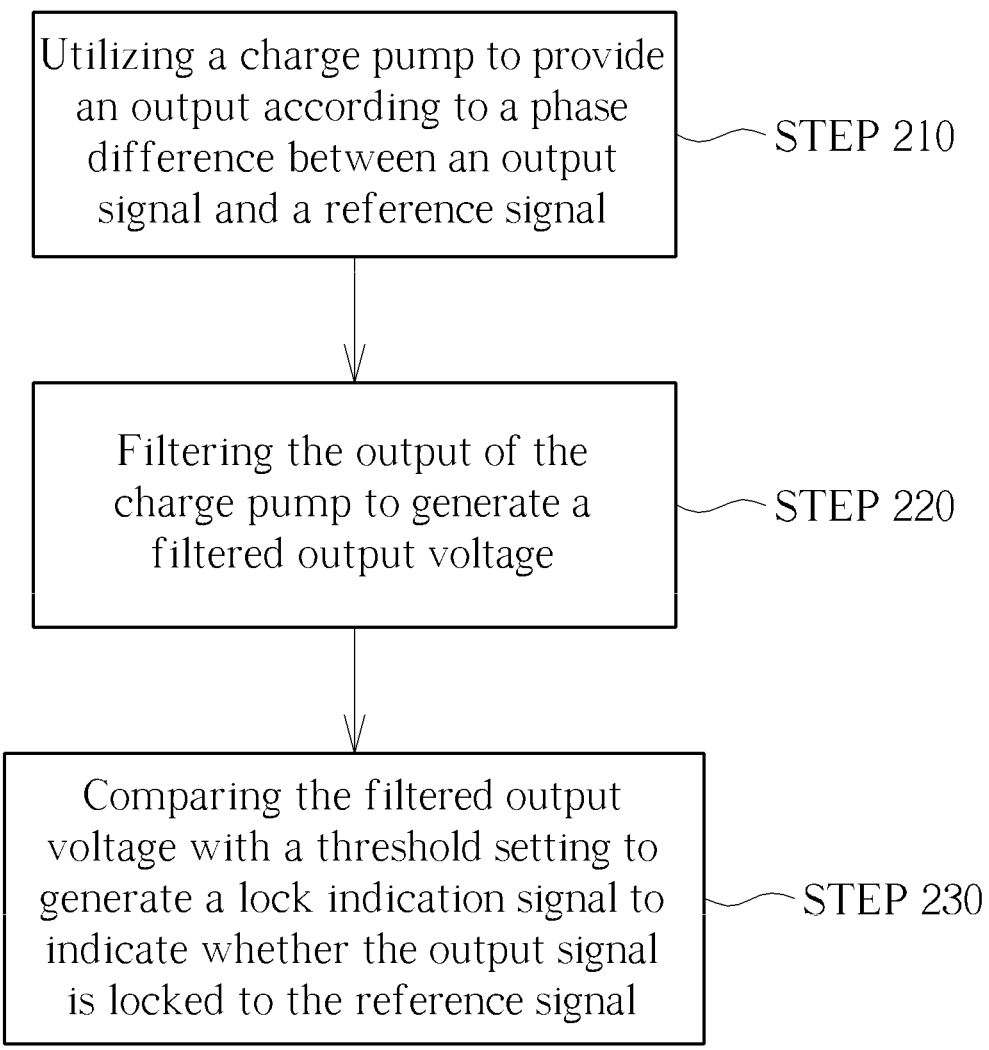
FIG. 3 is a flow chart of a method of determining a lock condition according to one exemplary embodiment of the present invention.

Based on the embodiments mentioned above, the present invention further provides a method of determining whether an output signal is locked to a reference signal. Please refer to FIG. 3, which illustrates a flow chart of the method according to one embodiment of the present invention. Firstly, a charge pump is utilized to provide an output according to a phase difference between the output signal and the reference signal in STEP 210. Then, the flow goes to STEP 220, in which the output of the charge pump is filtered to generate a filtered output voltage. Afterwards, the flow goes to STEP 230, in which the filtered output voltage is compared with a threshold setting to generate a lock indication signal to indicate whether the output signal is locked to the reference signal.

In one embodiment, STEP 210 comprises steps of: providing a pull-up circuit to selectively pull up a level of the output according to a first control signal that is generated based on the phase difference between the output signal and the reference signal; and providing a pull-down circuit to selectively pull down the level of the output according to a second control signal that is generated based on the phase difference between the output signal and the reference signal. Preferably, the pull-up circuit and the pull-down circuit of the charge pump used in the method of the present invention may have components similar to those included in the embodiments as mentioned above. However, the method of the present invention is not limited in scope to the components mentioned in the above-mentioned embodiments of the charge pump.

In one embodiment, STEP 210 further comprises steps of: preventing the first bias current from passing through the second transistor according to the first control signal; and preventing the second bias current from passing through the fourth transistor according to the second control signal.

In one embodiment, the threshold setting comprises a first threshold and a second threshold, and STEP 230 comprises: comparing the filtered output voltage with the first threshold and the second threshold. Preferably, the lock indication signal is generated to indicate the output signal is locked to the reference signal when the filtered output voltage falls with in a region between the first threshold and the second threshold.

Figure 4:
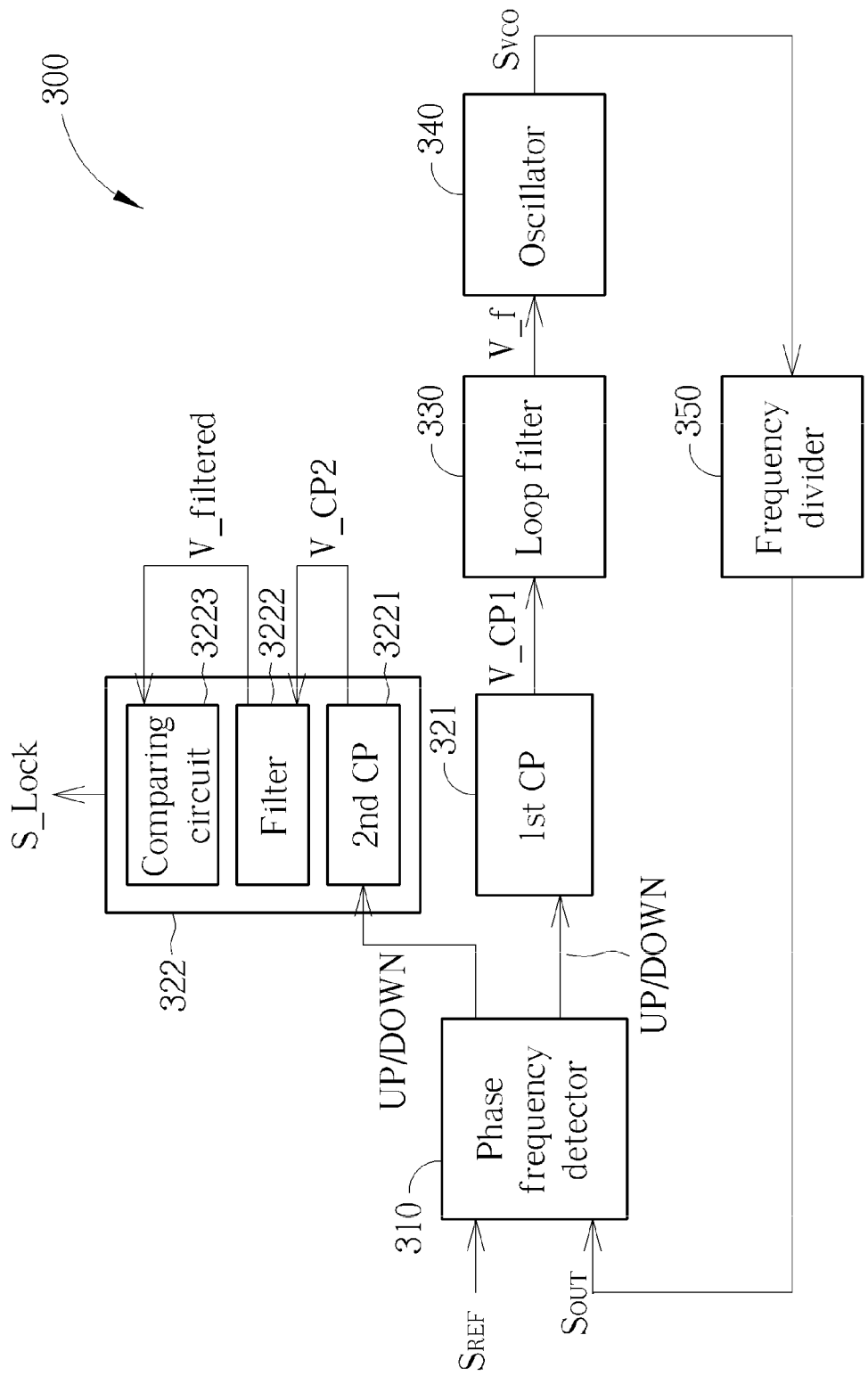
FIG. 4 is a block diagram of a PLL with a lock detector according to one exemplary embodiment of the present invention.

Based on the embodiments mentioned above, the present invention further provides a phase lock loop (PLL) having a lock detector. The PLL may be an integer/fractional-N PLL, which is illustrated in FIG. 4. The PLL having a lock detector 300 comprises a phase frequency detector 310, the first charge pump 321, a loop filter 330, an oscillator 340, an optional component, frequency divider 350, and a lock detector 322. The phase frequency detector is arranged for generating a first control signal UP and a second control signal DOWN according to a phase difference based on a reference signal $S_{REF}$, and an output signal $S_{OUT}$ which may be derived from the oscillator 340 or from the frequency divider 350. The first charge pump 321 is coupled to the phase frequency detector 310, and is arranged for providing a first output V_CP1 according to the phase difference. The loop filter 330 is coupled to the first charge pump 321, and is arranged for generating a filtered signal V_f according to the first output V_CP1 of the first charge pump 321. The oscillator 340 is coupled to the loop filter 330, and is arranged for generating the output signal $S_{VCO}$ according to the filtered signal V_f. The output signal $S_{VCO}$ may be directly used as the output signal $S_{OUT}$ or divided by the frequency divider 350 to generate the output signal $S_{OUT}$. The lock detector 322 comprises: a second charge pump 3221, a filter 3222, and a comparing circuit 3223. The second charge pump 3221 is arranged for providing a second output V_CP2 according to the phase difference (e.g. the control signals UP/DOWN). The filter 3222 is coupled to the second charge pump 3221, and is arranged for filtering the second output V_CP2 of the second charge pump 3221 to generate a filtered output voltage V_filtered. The comparing circuit 3223 is coupled to the filter 3222, and is arranged for comparing the filtered output voltage V_filtered with a threshold setting to generate a lock indication signal S_Lock to indicate whether the phase lock loop 300 is in a lock condition. When the phase of the output signal $S_{OUT}$ is completely identical to that of the reference signal $S_{REF}$ or the phase of the output signal $S_{OUT}$ is very close to that of the reference signal $S_{REF}$, the output S_Lock of the lock detector 322 goes high indicating a lock condition. On the other hand, when the phase of the output signal $S_{OUT}$ is much different from that of the reference signal $S_{REF}$, the output S_Lock of the lock detector 322 goes low indicating a indicating an out-of-lock condition. The principles and detailed operations of the lock detector 322 are similar to those of the lock detector 200, and therefore detailed descriptions regarding the lock detector 322 are omitted here for the sake of brevity.

Figure 5:
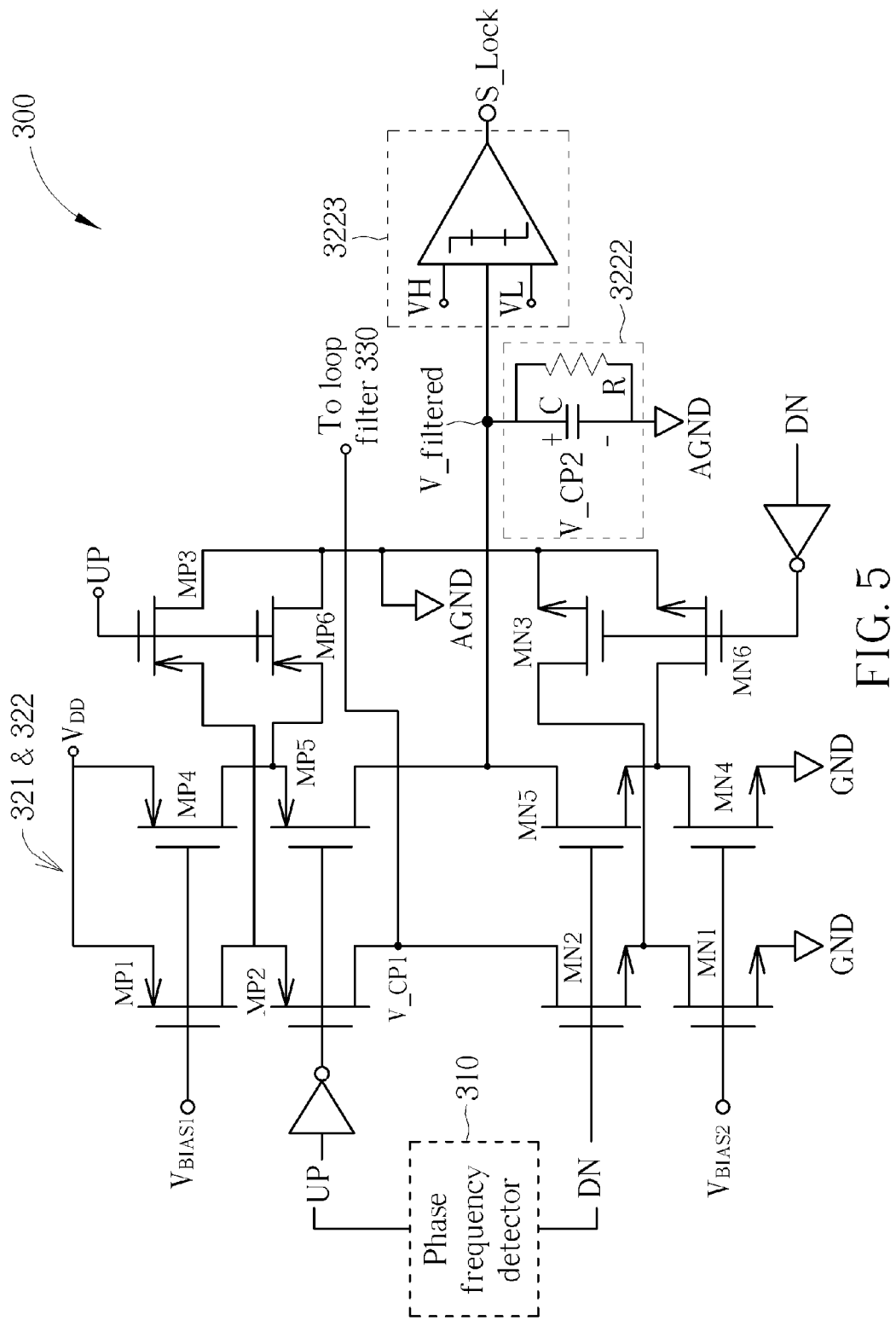
FIG. 5 is detailed circuit diagram of the PLL with the lock detector as shown in FIG. 4 according to one exemplary embodiment of the present invention.

FIG. 5 illustrates a detailed circuit diagram of a combination of the first charge pump 321 and the lock detector 322 according to one embodiment of the present invention. The first charge pimp 321 includes transistor MP1-MP3 and MN1-MN3 and generates the first output V_CP1 to the loop filter 330. The lock detector 322 includes second charge pump 3221 having transistors MP4-MP6 and MN4-MN6 generates the second output V_CP2 to the filter 3222. The second output V_CP2 of the second charge pump 3221 will not be provided to the loop filter 330. The filter 3222 generates the filtered output voltage V_filtered to the comparing circuit 3223. Accordingly, the comparing circuit 3223 compares the filtered output voltage V_filtered with threshold setting including threshold voltages VH and VL to generate the lock indication signal S_Lock. As can be seen from FIG. 5, the second charge pump 3221 is a replica of the first charge pump 321. Compared to the related-art lock detector, it is much simpler to implement the second charge pump 3221 and the lock detector 322. In addition, transistors MP4-MP6 and MN4-MN6 of the second charge pump 3221 may be scaled down with respect to the transistor MP1-MP3 and MN1-MN3 of first charge pump 321 to save power consumption.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In conclusion, the preset invention utilizes a charge pump to implement a lock detector. As the inventive lock detector has a filter to average the output generated according to the phase difference, any jittering during the lock condition or issues regarding delays of the alternating of the division ratio of the PLL can be properly addressed. Therefore, the inventive lock detector can register a steady lock indication signal during the lock condition. Furthermore, as the lock detector can be implemented based on a replica of the charge pump in the PLL, it is easy to achieve the invention in a semiconductor fabrication process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase lock loop having a lock detector, comprising:
a phase frequency detector, arranged for generating a first control signal and a second control signal according to a phase difference based on a reference signal and an output signal;
a first charge pump, coupled to the phase frequency detector, arranged for providing a first output according to the phase difference;
a loop filter, coupled to the first charge pump, arranged for generating a filtered signal according to the first output of the first charge pump; and
an oscillator, coupled to the loop filter, arranged for generating the output signal according to the filtered signal; and
a lock detector, comprising:
a second charge pump, arranged for providing a second output according to the phase difference;
a filter, coupled to the second charge pump, arranged for filtering the second output of the second charge pump to generate a filtered output voltage; and
a comparing circuit, coupled to the filter, arranged for comparing the filtered output voltage with a threshold setting to generate a lock indication signal to indicate whether the phase lock loop is in a lock condition,
wherein the threshold setting comprises a first threshold and a second threshold, and the comparing circuit is a window comparator arranged for comparing the filtered output voltage with the first threshold and the second threshold and the lock indication signal changes to indicate that the output signal is locked to the reference signal whenever the filtered output voltage enters a region between the first threshold and the second threshold and changes to indicate that the output signal is not locked to the reference signal whenever the filtered output voltage exits the region between the first threshold and the second threshold.

2. The phase lock loop of claim 1, wherein the filter of the lock detector is a low pass filter and comprises:
a resistor, having one end coupled to an output terminal of the second charge pump and another end coupled to a reference voltage level; and
a capacitor, having one end coupled to the output terminal of the second charge pump and another end coupled to the reference voltage level.

3. The phase lock loop of claim 1, wherein the second charge pump comprises:
a pull-up circuit, arranged for selectively pulling up a level of the second output according to the first control signal that is generated based on the phase difference between the output signal and the reference signal; and
a pull-down circuit, arranged for selectively pulling down the level of the second output according to the second control signal that is generated based on the phase difference between the output signal and the reference signal.

4. The phase lock loop of claim 3, wherein:
the pull-up circuit comprises:
a first transistor, coupled to a supply voltage, arranged for providing a first bias current according to a first bias voltage; and
a second transistor, coupled to the first transistor and an output terminal of the lock detector, arranged for selectively providing a first current path for first bias current from the first transistor to the output terminal according to the first control signal, thereby pulling up the level of the second output; and the pull-down circuit comprises:
a third transistor, coupled to a ground, arranged for providing a second bias current according to a second bias voltage; and
a fourth transistor, coupled to the third transistor and the output terminal of the lock detector, for selectively providing a second current path for the second bias current from the output terminal to the third transistor according to the second control signal, thereby pulling down the level of the second output.

5. The phase lock loop of claim 4, wherein the second charge pump further comprises:
a first switching circuit, coupled to the pull-up circuit and a reference level arranged for preventing the first bias current from passing through the second transistor according to the first control signal; and
a second switching circuit, coupled to the pull-down circuit and the reference level, arranged for preventing the second bias current from passing through the fourth transistor according to the second control signal.

6. The phase lock loop of claim 1, wherein the first charge pump comprises a plurality of first transistors, and the second pump comprises a plurality of second transistors, wherein a size of each of the first transistors is larger than that of each of the second transistors.

7. The phase lock loop of claim 1, wherein the second output is not provided to the loop filter.

8. A phase lock loop having a lock detector, comprising:
a phase frequency detector, arranged for generating a first control signal and a second control signal according to a phase difference based on a reference signal and a divided output signal;
a first charge pump, coupled to the phase frequency detector, arranged for providing a first output according to the phase difference;
a loop filter, coupled to the first charge pump, arranged for generating a filtered signal according to the first output of the first charge pump; and
an oscillator, coupled to the loop filter, arranged for generating an output signal according to the filtered signal;
a divider, coupled to the oscillator and the phase frequency detector, arranged for dividing the output signal to generate the divided output signal; and
a lock detector, comprising:
a second charge pump, arranged for providing a second output according to the phase difference;
a filter, coupled to the second charge pump, arranged for filtering the second output of the second charge pump to generate a filtered output voltage; and
a comparing circuit, coupled to the filter, arranged for comparing the filtered output voltage with a threshold setting to generate a lock indication signal to indicate whether the phase lock loop is in a lock condition;
wherein the threshold setting comprises a first threshold and a second threshold, and the comparing circuit is a window comparator arranged for comparing the filtered output voltage with the first threshold and the second threshold and the lock indication signal changes to indicate that the divided output signal is locked to the reference signal whenever the filtered output voltage enters a region between the first threshold and the second threshold and changes to indicate that the divided output signal is not locked to the reference signal whenever the filtered output voltage exits the region between the first threshold and the second threshold.

9. The phase lock loop of claim 8, wherein the filter of the lock detector is a low pass filter and comprises:
- a resistor, having one end coupled to an output terminal of the second charge pump and another end coupled to a reference voltage level; and
- a capacitor, having one end coupled to the output terminal of the second charge pump and another end coupled to the reference voltage level.

10. The phase lock loop of claim 8, wherein the second charge pump comprises:
- a pull-up circuit, arranged for selectively pulling up a level of the second output according to the first control signal that is generated based on the phase difference between the divided output signal and the reference signal; and
- a pull-down circuit, arranged for selectively pulling down the level of the second output according to the second control signal that is generated based on the phase difference between the divided output signal and the reference signal.

11. The phase lock loop of claim 10, wherein:
the pull-up circuit comprises:
- a first transistor, coupled to a supply voltage, arranged for providing a first bias current according to a first bias voltage; and
- a second transistor, coupled to the first transistor and an output terminal of the lock detector, arranged for selectively providing a first current path for first bias current from the first transistor to the output terminal according to the first control signal, thereby pulling up the level of the second output; and the pull-down circuit comprises:
- a third transistor, coupled to a ground, arranged for providing a second bias current according to a second bias voltage; and
- a fourth transistor, coupled to the third transistor and the output terminal of the lock detector, for selectively providing a second current path for the second bias current from the output terminal to the third transistor according to the second control signal, thereby pulling down the level of the second output.

12. The phase lock loop of claim 11, wherein the second charge pump further comprises:
- a first switching circuit, coupled to the pull-up circuit and a reference level arranged for preventing the first bias current from passing through the second transistor according to the first control signal; and
- a second switching circuit, coupled to the pull-down circuit and the reference level, arranged for preventing the second bias current from passing through the fourth transistor according to the second control signal.

13. The phase lock loop of claim 8, wherein the first charge pump comprises a plurality of first transistors, and the second pump comprises a plurality of second transistors, wherein a size of each of the first transistors is larger than that of each of the second transistors.

14. The phase lock loop of claim 8, wherein the second output is not provided to the loop filter.

15. A phase lock loop having a lock detector, comprising:
- a phase frequency detector, arranged for generating a first control signal and a second control signal according to a phase difference based on a reference signal and an output signal;
- a first charge pump, coupled to the phase frequency detector, arranged for providing a first output according to the phase difference;
- a loop filter, coupled to the first charge pump, arranged for generating a filtered signal according to the first output of the first charge pump; and
- an oscillator, coupled to the loop filter, arranged for generating the output signal according to the filtered signal; and
- a lock detector, comprising:
  - a second charge pump, arranged for providing a second output according to the phase difference;
  - a filter, coupled to the second charge pump, arranged for filtering the second output of the second charge pump to generate a filtered output voltage; and
  - a comparing circuit, coupled to the filter, arranged for comparing the filtered output voltage with a threshold setting to generate a lock indication signal to indicate whether the phase lock loop is in a lock condition;
  wherein the threshold setting comprises a first threshold and a second threshold, and the comparing circuit is a window comparator arranged for comparing the filtered output voltage with the first threshold and the second threshold and the lock indication signal changes to indicate that the phase lock loop is in the lock condition whenever the filtered output voltage enters a region between the first threshold and the second threshold and changes to indicate that the phase lock loop is not in the lock condition whenever the filtered output voltage exits the region between the first threshold and the second threshold.

16. The phase lock loop of claim 15, wherein the filter of the lock detector is a low pass filter and comprises:
- a resistor, having one end coupled to an output terminal of the second charge pump and another end coupled to a reference voltage level; and
- a capacitor, having one end coupled to the output terminal of the second charge pump and another end coupled to the reference voltage level.

17. The phase lock loop of claim 15, wherein the second charge pump comprises:
- a pull-up circuit, arranged for selectively pulling up a level of the second output according to the first control signal that is generated based on the phase difference between the output signal and the reference signal; and
- a pull-down circuit, arranged for selectively pulling down the level of the second output according to the second control signal that is generated based on the phase difference between the output signal and the reference signal.

18. The phase lock loop of claim 17, wherein:
the pull-up circuit comprises:
- a first transistor, coupled to a supply voltage, arranged for providing a first bias current according to a first bias voltage; and
- a second transistor, coupled to the first transistor and an output terminal of the lock detector, arranged for selectively providing a first current path for first bias current from the first transistor to the output terminal according to the first control signal, thereby pulling up the level of the second output; and the pull-down circuit comprises:
- a third transistor, coupled to a ground, arranged for providing a second bias current according to a second bias voltage; and
- a fourth transistor, coupled to the third transistor and the output terminal of the lock detector, for selectively providing a second current path for the second bias current from the output terminal to the third transistor according to the second control signal, thereby pulling down the level of the second output.

19. The phase lock loop of claim 18, wherein the second charge pump further comprises:
a first switching circuit, coupled to the pull-up circuit and a reference level arranged for preventing the first bias current from passing through the second transistor according to the first control signal; and
a second switching circuit, coupled to the pull-down circuit and the reference level, arranged for preventing the second bias current from passing through the fourth transistor according to the second control signal.

20. The phase lock loop of claim 15, wherein the first charge pump comprises a plurality of first transistors, and the second pump comprises a plurality of second transistors, wherein a size of each of the first transistors is larger than that of each of the second transistors.

21. The phase lock loop of claim 15, wherein the second output is not provided to the loop filter.

* * * * *